United States Patent [19]
Sachdev

[11] Patent Number: 6,127,838
[45] Date of Patent: Oct. 3, 2000

[54] IDDQ TESTABLE PROGRAMMABLE LOGIC ARRAYS

[75] Inventor: Manoj Sachdev, Eindhoven, Netherlands

[73] Assignee: U.S. Philips Corporation, New York, N.Y.

[21] Appl. No.: 09/033,728

[22] Filed: Mar. 3, 1998

[30] Foreign Application Priority Data

Mar. 21, 1997 [EP] European Pat. Off. ............. 97200847

[51] Int. Cl.⁷ .................................................. H03K 19/00
[52] U.S. Cl. .................................. 326/16; 326/41; 326/46
[58] Field of Search .................................. 326/16, 39, 41, 326/45, 46, 95–97, 49, 50; 371/22.1, 22.2

[56] References Cited

U.S. PATENT DOCUMENTS

| | | |
|---|---|---|
| 4,212,026 | 7/1980 | Balasubramanian et al. ............. 326/44 |
| 4,517,672 | 5/1985 | Pfleiderer et al. ....................... 714/742 |
| 4,536,881 | 8/1985 | Kasuya ...................................... 377/70 |
| 4,768,196 | 8/1988 | Jou et al. .................................. 371/25 |
| 4,920,515 | 4/1990 | Obata ........................................ 326/16 |
| 5,083,047 | 1/1992 | Horie et al. .............................. 326/45 |
| 5,504,755 | 4/1996 | Nozuyama .......................... 395/500.05 |

*Primary Examiner*—Michael Tokar
*Assistant Examiner*—Don Phu Le
*Attorney, Agent, or Firm*—Brian J. Wieghaus

[57] ABSTRACT

The invention relates to an integrated circuit comprising a dynamic CMOS Programmable Logic Array (PLA) with an AND plane and an OR plane. The invention also relates to a method for testing such a circuit. A PLA according to the invention is provided with means enabling detection of bridging faults. Adjacent lines can be driven to complementary logic levels. Crosspoint transistors can be switched off. In this way, bridging faults between lines give rise to an observable elevated quiescent power supply current (IDDQ).

13 Claims, 3 Drawing Sheets

IDDQ TESTABLE PROGRAMMABLE LOGIC ARRAYS

BACKGROUND OF THE INVENTION

The invention relates to an integrated circuit comprising a dynamic CMOS Programmable Logic Array with an AND plane and an OR plane, the AND plane comprising a first matrix of first row lines and first column lines, the first column lines comprising 2n bit lines derived from n inputs, and the first row lines comprising m product lines, each product line being accompanied with a corresponding adjacent first evaluate line, the bit lines controlling first crosspoint transistors connecting product lines to corresponding first evaluate lines, the OR plane comprising a second matrix of second row lines and second column lines, the second row lines comprising m product term lines and the second column lines comprising k sum lines feeding k outputs, each sum line being accompanied with a corresponding adjacent second evaluate line, the product term lines controlling second crosspoint transistors connecting sum lines to corresponding second evaluate lines, each product term line corresponding to a respective product line, the product lines and the sum lines forming a set of precharge lines.

The invention further relates to a method for testing an integrated circuit comprising a dynamic CMOS Programmable Logic Array with an AND plane and an OR plane.

The Programmable Logic Array (PLA) is an important building block for VLSI circuits. It is commonly used in the design of instruction decoders of microprocessors, and combinational circuitry of finite state machines. The widespread use of the PLA is due to its simple architecture and availability of programs to automate the synthesis process. Dynamic PLAs are preferred compared to their static counterparts due to smaller area, low power dissipation and the ability to pipeline the processing for increased throughput.

In spite of their merits, PLAs are notorious for poor testability. Built In Self Test (BIST) schemes have been devised for functional testing of PLAs. However, these test schemes normally entail a large number of extra gates and test vectors. A second drawback is that implementation of these test schemes often heavily depends on the function implemented in the PLA, which leads to extra steps in the design process. A third drawback is that the known test schemes do not enable explicit testing for bridging faults between nodes. A bridging fault is formed by an unintended conductive bridge of low resistance. For circuits as specified in the preamble, bridging faults are particularly relevant in view of the large number of interconnections and densely packed lines. It has been found that, under the special circumstances of testing, a considerable amount of such defects are not detected by functional testing.

SUMMARY OF THE INVENTION

It is, inter alia, an object of the invention to provide an integrated circuit as specified in the preamble which enables explicit testing for bridging faults between nodes.

To this end, the invention provides an electronic circuit as specified in the preamble that is characterized in that the circuit is arranged for during a test mode simultaneously driving lines of pairs of adjacent first row lines and/or second column lines to complementary logic levels and keeping the crosspoint transistors connected to said pairs in an off state. In this way, a bridging defect between lines of said pairs will give rise to an elevated power supply current. Monitoring the power supply current (which is known as IDDQ testing) then reveals the presence of the bridging defect. An advantage of this IDDQ testable circuit is that crosspoint transistor leakage can be detected as well. Furthermore, in order to implement the invention in a circuit as specified in the preamble, no function-dependent measures have to be taken. The latter means that the design process of the PLA is not burdened with extra design steps. Moreover, the invention can be implemented very efficiently in terms of IC area overhead.

A method for testing according to the invention comprises the steps of
 (1) driving lines of pairs of adjacent row lines in the AND plane and pairs of adjacent column lines in the OR plane to complementary logic levels while simultaneously keeping crosspoint transistors feeding said lines in an off state and measuring a quiescent power supply current;
 (2) driving lines of pairs of adjacent column lines in the AND plane and pairs of adjacent row lines in the OR plane to complementary logic levels while measuring a quiescent power supply current.

Such a method will either replace or complement known functional test schemes. The quiescent power supply current can be measured by a Built-In Current Sensor (BISC) or by an off-chip current sensor connected to the IC during test. A method for testing according to the invention can be carried out very efficiently in terms of test time.

According to an aspect of the invention, the integrated circuit is characterized in that the bit lines and the product term lines are connected to respective outputs of logic gates, an input of each logic gate being connected to a first test control line, the arrangement being such that the logic gates enable driving the bit lines and product term lines to a switch off level of the crosspoint transistors connected thereto, under control of the first test control line. This enables switching off the crosspoint transistors under control of a single control signal, irrespective the state of the inputs and the product lines, in that way disabling current leakage through crosspoint transistors, which would otherwise conceal current leakage through bridging defects.

According to an embodiment of the invention, the integrated circuit is characterized in that the precharge lines are connected to respective precharge transistors and that the evaluate lines are connected to respective evaluate transistors, the arrangement being such that adjacent first row lines and adjacent second column lines switch to complementary logic levels. This expresses the understanding that for each pair of lines consisting of a precharge line and a corresponding evaluate line, one has the freedom to choose to precharge to either one of the possible logic levels (and to evaluate to the complementary logic level). By applying this understanding when choosing the precharge level and evaluate level for a particular pair, no matter what the layout of precharge lines and evaluate lines is, it is always possible to have an arrangement in which adjacent lines switch to complementary logic levels. In PLAs in which precharge lines and evaluate line alternate, that constraint is automatically met when precharge is done to a first level and evaluate to a second. Often, however, the product lines and sum lines are rearranged with respect to the evaluate lines in order to optimize for IC area. Then, according to the invention, said understanding can be applied in order to arrive at an IDDQ testable dynamic PLA.

According to another embodiment of the invention, the integrated circuit is characterized in that the precharge lines are connected to respective precharge transistors switching the precharge lines in a normal mode to a first level, and the evaluate lines are connected to respective evaluate transistors switching the evaluate lines in the normal mode to a second level, complementary to the first level, pairs of corresponding precharge transistors and evaluate transistors being arranged for inverting said levels under control of a second test control line, said pairs being chosen such that in the test mode adjacent first row lines and adjacent second column lines switch to complementary logic levels. Though such a circuit is IDDQ testable, in the normal mode it uses a preferred logic level for a particular line. It could, for example, be unacceptable that NMOS crosspoint transistors in the normal mode switch precharge lines to logic high because of threshold voltage drop. In that case, these crosspoint transistors switch the corresponding precharge lines to logic low in the normal mode and to logic high in the test mode. The same applies to the evaluate lines.

According to an aspect of the invention, the integrated circuit is characterized in that the circuit is arranged for during the test mode keeping the precharge transistors and the evaluate transistors in an on state simultaneously. This allows all possible pairs of adjacent first row lines and second column lines to be tested for bridging defects simultaneously. Therefore, such a circuit can be tested in very little time.

According to an aspect of the invention, the integrated circuit is characterized in that the circuit is arranged for during the test mode keeping the precharge transistors in an off state and the evaluate transistors in an on state simultaneously. In this way, crosspoint transistors in an on state will not leak current. Thus, by driving adjacent bit lines or adjacent product term lines to complementary logic levels, bridging defects between adjacent bit lines and adjacent product term lines can be detected by IDDQ testing. Of course, the same can be accomplished with a circuit that is arranged the other way around, i.e. in which the precharge transistors and the evaluate transistors simultaneously can be kept in an on state and an off state, respectively.

The invention is further explained below by way of example with reference to the accompanying drawing, in which like reference numerals denote the same or corresponding parts.

DESCRIPTION OF THE PREFERRED EMBODIMENTS

Figure 1:
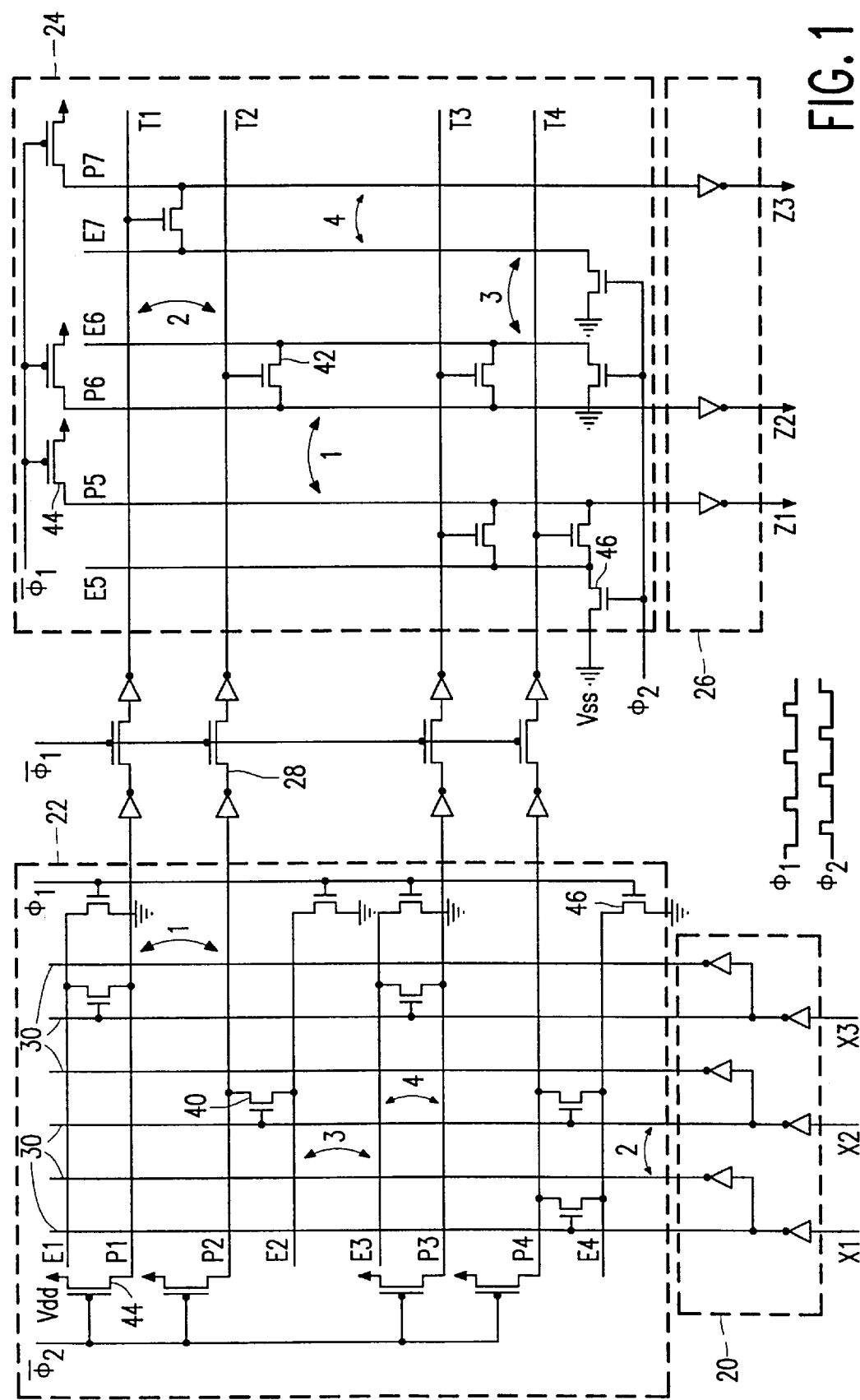
FIG. 1 is a schematic of a typical known dynamic PLA with some representative bridging defects.

FIG. 1 is a schematic of a typical known dynamic PLA with some representative bridging defects. It comprises an input decoder 20, an AND plane 22, an OR plane 24 and output buffering 26. The device has 3 inputs X1–X3, 4 product lines P1–P4, and 3 outputs Z1–Z3.

The distinctive feature of a dynamic PLA is the presence of precharge and evaluate lines in AND plane and OR plane. The precharge lines of the AND plane 22 are the product lines P1–P4. The AND plane 22 further comprises six bit lines 30 derived from the inputs X1–X3 by the input decoder 20, first evaluate lines E1–E4, paired to the product lines P1–P4, respectively, and first crosspoint transistors 40. Respective gates of the first crosspoint transistors 40 are connected to the bit lines and respective sources and drains are connected to pairs of the product lines P1–P4 and the corresponding first evaluate lines E1–E4. Product terms of a function to be programmed in the PLA are realized according to whether or not first crosspoint transistors 40 are inserted at particular locations in the AND plane 22. In the figure, only one of the six first crosspoint transistors 40 in the AND plane 22 is provided with a reference numeral in order to maintain clarity of the circuit.

The precharge lines of the OR plane 24 are sum lines P5–P7. The OR plane 24 further comprises four product term lines T1–T4 coupled to the four product lines P1–P4 via dynamic latches 28, each one of which comprising two inverting buffers and a transistor, second evaluate lines E5–E7, paired to the sum lines P5–P7, respectively, and second crosspoint transistors 42. Respective gates of the second crosspoint transistors 42 are connected to the product term lines and respective sources and drains are connected to pairs of the sum lines P5–P7 and the corresponding second evaluate lines E5–E7. Sum terms of a function to be programmed in the PLA are realized according to whether or not second crosspoint transistors 42 are inserted at particular locations in the OR plane 24. In the figure, only one of the four dynamic latches 28 is provided with a reference numeral in order to maintain clarity of the circuit.

A two phase non-overlapping clock scheme is generally used. During a $\phi_1$ phase the AND plane 22 is evaluated and the OR plane 24 is precharged. The first crosspoint transistors 40 enable the product lines P1–P4 to be conditionally discharged, depending on the state of the inputs X1–X3. During a $\phi_2$ phase, the OR plane 24 is evaluated and the AND plane 22 is precharged. The second crosspoint transistors 42 enable the sum lines P5–P7 to be conditionally discharged, depending on the state of the product term lines TI–T4. The dynamic latches 28 are placed between the AND plane 22 and the OR plane 24 to buffer the AND plane 22 output.

The precharge and evaluate lines in a dynamic PLA are usually rearranged during layout to make efficient use of the area. Therefore, as indicated in FIG. 1, in the AND plane 22 sometimes two product lines are adjacent to each other and sometimes two first evaluate lines are adjacent to each other. Similarly, in the OR plane 24 sometimes sum lines are adjacent to each other and sometimes two second evaluate lines are adjacent to each other.

In a dynamic PLA, there are three classes of devices: the crosspoint transistors 40 and 42, pull-up transistors 44 and pull-down transistors 46. These transistors may have stuck-on behaviour or stuck-open behaviour. Furthermore, a PLA has a large number of interconnections which are susceptible for bridging defects amongst them. In general, there are four basic types of bridging faults possible in AND and OR planes which are illustrated in FIG. 1. These bridging faults are: (1) a conductive bridge between two adjacent precharge lines, (2) a conductive bridge between either two adjacent bit lines or two adjacent product term lines, (3) a conductive bridge between two adjacent evaluate lines, (4) a conductive bridge between a precharge line and an adjacent evaluate line.

Figure 2:
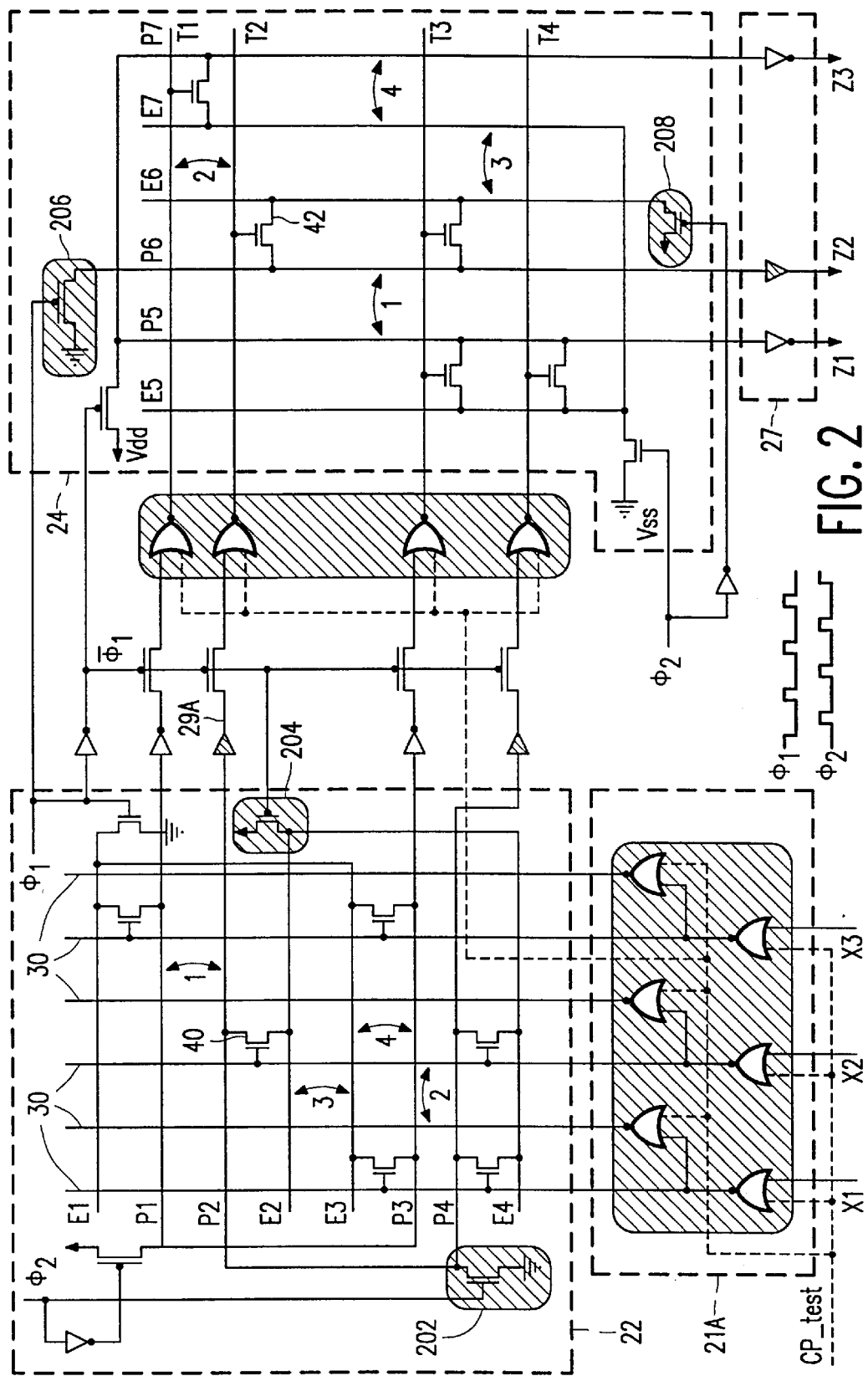
FIG. 2 is a schematic of an IDDQ testable dynamic PLA according to a first embodiment of the invention.

FIG. 2 is a schematic of an IDDQ testable dynamic PLA according to a first embodiment of the invention. The circuit of FIG. 2 is largely the same as the circuit of FIG. 1 except for the highlighted areas. Notably, compared to FIG. 1, the circuit of FIG. 2 comprises a modified input decoder 21A, modified dynamic latches 29A, each of which comprising a buffer, a transistor and a NOR gate, modified output buffering 27, and modified precharge arrangements 202, 206 and modified evaluate arrangements 204, 208.

In a dynamic PLA, the corresponding precharge lines and evaluate lines should be complementary. For example, if the product lines are precharged to Vdd, then evaluation should be done to Vss (FIG. 1) or vice-versa. According to an aspect of the invention, provided that the precharge and evaluation to complementary logic levels constraint is met, one has freedom to choose the Vdd or Vss for individual product or sum lines for precharge (evaluation). This understanding has been exploited in FIG. 2. The odd product lines P1 and P3 in the AND plane 22 and the odd sum lines P5 and P7 in the OR plane 24 are precharged to Vdd as before. However, the even product lines P2 and P4 in the AND plane 22 and the even sum line P6 in the OR plane 24 are precharged to Vss (precharge arrangements 202 and 206, respectively). Similarly, the even evaluate lines E2, E4 and E6 are also modified. These lines are evaluated to Vdd (evaluate arrangements 204 and 208). In the dynamic latches 29A and the output buffering 27, the even product lines P2 and P4 and the even sum line P6 are buffered with non-inverting buffers so as to maintain the proper logic operation. A test control line CP_test is provided. CP_test in the normal mode is kept at logic low which ensures the normal PLA operation. At the instance when CP_test is high, the input decoder 21A pulls down all bitlines in the AND plane 22 and all product term lines in the OR plane 24, ensuring no crosspoint transistor 40, 42 is on.

Let us consider the above mentioned four categories of bridging faults. For a first IDDQ measurement, both the clock phases $\phi_1$ and $\phi_2$ are kept high which will ensure that all the precharge lines P1–P7 and all the evaluate lines E1–E7 in both the planes are active at the same time. Now, depending upon input stimuli conditions, some crosspoint transistors 40, 42 may be on which will invalidate the measurement. Therefore, CP_test is also kept high so that all crosspoint transistors 40, 42 are in off state. Since, all adjacent precharge lines P1–P7 and evaluate lines E1–E7 are driven to complementary logic levels, any bridging fault amongst them will result into elevated quiescent current. Therefore, all type 1,3,4 faults as well as leakage faults in all crosspoint transistors 40, 42 will be detected by this measurement. This test is independent of the function implemented in the PLA. Some extra transistors/gates are needed to facilitate the test. However, compared to the known integrated circuit of FIG. 1 the proposed configuration needs very few extra gates. The impact of the extra hardware on performance is insignificant.

A second IDDQ measurement is needed to test for type 2 faults in the AND plane 22. During this measurement, the clock phase $\phi_1$ is kept low and the clock phase $\phi_2$ is kept high, and the test signal CP_test is kept low. These conditions ensure that no first crosspoint transistor 40 is on in the AND plane 22. Now, the adjacent inputs X1–X3 are driven to complementary logic levels such that all type 2 faults are excited in the AND plane 22 and are detected by elevated quiescent current. This test is also independent of the function implemented in the PLA. Similarly, type 2 faults in the OR plane 24 can also be detected by keeping adjacent product term lines T1–T4 to complementary logic levels. However, realizing it depends on the implemented function. In other words, the test effectiveness is dependent of the implemented function in the AND plane 22. Table 1 shows these three IDDQ measurements for the first embodiment, with test conditions and detected faults by each measurement.

TABLE 1

Faults in the second embodiment and their detection conditions

| Test | Test Conditions | Detected Faults | Comments |
|---|---|---|---|
| I1 | $\phi_1 = 1, \phi_2 = 1,$ CP_test = 1 | AND plane and OR plane: type 1, 3, 4 faults, all stuck-on crosspoint faults | function independent test |
| I2 | $\phi_1 = 0, \phi_2 = 1,$ CP_test = 0 | AND plane: type 2 faults | function independent test |
| I3 | $\phi_1 = 1, \phi_2 = 0,$ CP_test = 0 | OR plane: type 2 faults | function dependent test |

In this embodiment, the even precharge lines P2, P4, P6 are evaluated to logic high through the NMOS crosspoint transistors 40, 42. Such a scheme will result in the evaluation to Vdd-Vtp voltage on the even precharge lines P2, P4, P6, in which Vtp designates the threshold voltage drop, characterizing the NMOS transistors. Therefore, care should be taken in the design of the subsequent latches 29A and the output buffering 27, such that they take into account the threshold voltage drop for these lines. The threshold voltage drop on the even precharge lines P2, P4, P6 may be an issue for robust design. It may also result in dc power dissipation in the dynamic latches 29A and the output buffering 27, which will result in increased power consumption. Finally, in low voltage applications, it may result in unacceptably reduced noise margins. There are several possible solutions to solve the problem of threshold voltage drop on the even precharge lines P2, P4, P6. Replacing the NMOS crosspoint transistors 40, 42 with PMOS crosspoint transistors for the even precharge lines P2, P4, P6 is probably the simplest. Such an arrangement will not result in threshold voltage drop. However, it does have other unwanted consequences. For example, testing of type 4 bridging defects will require an elaborate arrangement since forcing logic zero will not switch off PMOS crosspoint transistors. Furthermore, there will be constraints on logic implementation in the AND plane 22 and the OR plane 24. Application of latches or sense amplifiers instead of inverters (buffers) to restore the logic level is yet another solution. However, it may increase the complexity of the PLA and reduce performance without really adding a significant benefit.

Figure 3:
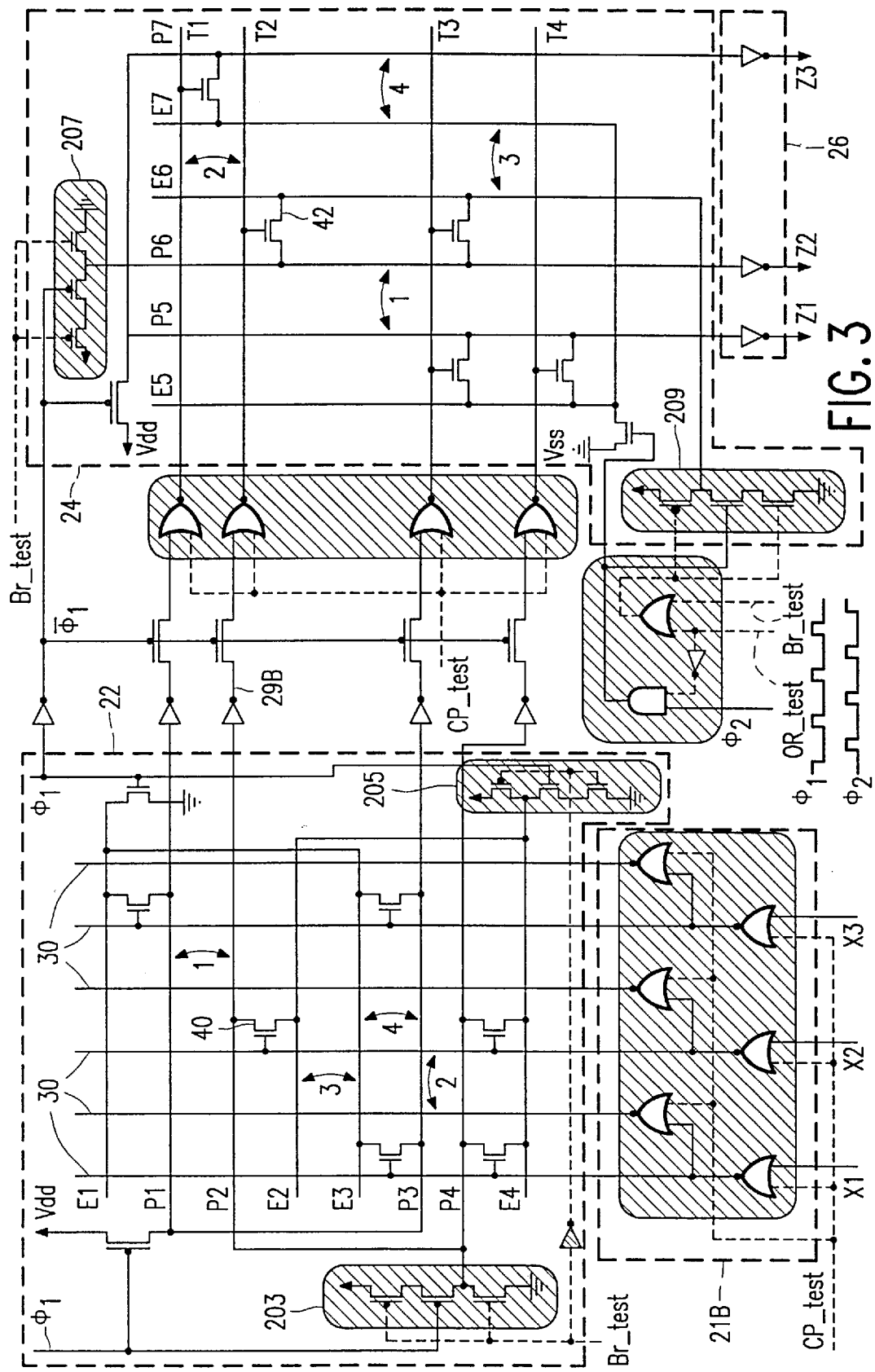
FIG. 3 is a schematic of an IDDQ testable dynamic PLA according to a second embodiment of the invention.

FIG. 3 is a schematic of an IDDQ testable dynamic PLA according to a second embodiment of the invention. The circuit of FIG. 3 is largely the same as the circuit of FIG. 1 except for the highlighted areas. Notably, compared to FIG. 1, the circuit of FIG. 3 comprises a modified input decoder 21B, modified dynamic latches 29B, each of which comprising an inverting buffer, a transistor and a NOR gate, and modified precharge arrangements 203, 207 and modified evaluate arrangements 205, 209.

It illustrates a modified version of the first embodiment which retains the fault coverage of the previous scheme, alleviates the problem of the threshold voltage drop, and does not result in excessive area and performance penalties. However, this scheme requires two additional test control signals. A second test control line Br_test is provided to control the even precharge lines P2, P4, P6 and the even evaluate lines E1, E2, E6 in the test mode. Similarly, a third test control line OR_test is provided to control the evaluate lines E5–E7 in the OR plane 24 in the test mode. In the normal mode, Br_test as well as OR_test are kept at logic low and the PLA functions as usual, i.e. the product lines P1–P4 and the sum lines P5–P7 are precharged to logic high and evaluated to logic low. However, under test conditions these lines are driven logic high to excite different types of faults. These conditions will be explained in the subsequent paragraphs.

Detection of bridging faults in this PLA is similar to the previous one. For detection of type 1, 3, and 4 bridging faults in both planes the following conditions are required. CP_test is kept at logic high so that all the crosspoint transistors 40, 42 in the PLA are in non-conduction state. The clock phase $\phi_1$ is kept high which drives logic low on the odd first evaluate lines E1, E3 and the odd precharge lines P5, P7. The clock phase $\phi_2$ is also kept high which enables the odd product lines P1, P3 to be logic high. Furthermore, Br_test is kept at logic high and OR_test is kept at logic low which enables the odd evaluate lines E5, E7 to be driven logic high, the even precharge lines P2, P4, P6 to be driven logic low and the even evaluate lines E2, E4, E6 to be driven logic high. Under these conditions, any bridging fault of above mentioned categories in both planes as well as leakage faults in all the crosspoint transistors 40, 42 will be detected by this measurement. This measurement is independent of the function implemented in the PLA.

Detection of type 2 bridging faults in the AND plane 22 requires an additional IDDQ measurement. In this measurement, the clock phase $\phi_1$ is kept at logic high and the clock phase $\phi_2$ is kept at logic low. Furthermore, all the test control lines (CP_test, Br_test, and OR_test) are also kept at logic low. These conditions ensure that no crosspoint transistor 40 is on in the AND plane 22. Now, the adjacent inputs X1–X3 are driven to complementary logic levels such that all type 2 bridging faults between the bit lines 30 are excited and can be detected by elevated quiescent current. Like the first measurement, this measurement is independent of the function implemented in the PLA.

For detecting type 2 faults in the OR plane 24 independently of the implemented function, the following scheme is applied. The clock phase $\phi_2$ is kept high which enables the odd product lines T1, T3 to be logic high. Br_test is also kept high which ensures that the even product term lines T2, T4 are driven logic low. Now, the clock phase $\phi_1$ is kept high and CP_test is kept low. Such an arrangement ensures that the adjacent product term lines T1–T4 in the OR plane 24 are driven to complementary logic levels. Unfortunately, keeping both clock phases high excites the sum lines P5–P7 and the evaluate lines E5–E7 to complementary logic levels which may cause leakage through the second crosspoint transistors 42 depending upon the logic state of the product lines P1–P4. Therefore, to avoid invalidation of the test, the third test control signal OR_test is provided to control the evaluate lines E5–E7 in the high impedance state. The OR_test signal, which is normally is kept at logic low, is kept at logic high for this test. Under these conditions a type 2 bridging fault between adjacent product term lines T1–T4 will give rise to elevated IDDQ level. Table 2 shows these three IDDQ measurements for the second embodiment, with test conditions and detected faults by each measurement.

With respect to both the first and the second embodiment of the invention as described in the previous paragraphs, it is worthwhile to note that there may be situations where it is not possible to have many extra inputs for test purposes. In such cases, an onboard state machine can be designed with only one or two inputs whose outputs may be decoded to derive these signals. Alternatively, CP_test may be decoded from both the clock phases. As it is clear from Tables 1 and 2, a high CP_test is needed only when both clock phases are high. Therefore, this signal may be derived from clock phases.

TABLE 2

Faults in the second embodiment and their detection conditions

| Test | Test Conditions | Detected Faults | Comments |
|---|---|---|---|
| I1 | $\phi_1 = 1$, $\phi_2 = 1$, CP_test = 1, Br_test = 1, OR_test = 0 | AND plane and OR plane: type 1, 3, 4 faults, all stuck-on crosspoint faults | function independent test |
| I2 | $\phi_1 = 1$, $\phi_2 = 0$, CP_test = 0, Br_test = 0, OR_test = 0, inputs with compl. data | AND plane: type 2 faults | function independent test |
| I3 | $\phi_1 = 1$, $\phi_2 = 1$, CP_test = 0, Br_test = 1, OR_test = 1 | OR plane: type 2 faults | function independent test |

What is claimed is:

1. An integrated circuit comprising a dynamic CMOS Programmable Logic Array with an AND plane and an OR plane, the AND plane comprising a first matrix of first row lines and first column lines, the first column lines comprising 2n bit lines derived from n inputs, and the first row lines comprising m product lines, each product line being accompanied with a corresponding adjacent first evaluate line, the bit lines controlling first crosspoint transistors connecting product lines to corresponding first evaluate lines, the OR plane comprising a second matrix of second row lines and second column lines, the second row lines comprising m product term lines and the second column lines comprising k sum lines feeding k outputs, each sum line being accompanied with a corresponding adjacent second evaluate line, the product term lines controlling second crosspoint transistors connecting sum lines to corresponding second evaluate lines, each product term line corresponding to a respective product line, the product lines and the sum lines forming a set of precharge lines, characterized in that the circuit includes a test circuit which during a test mode simultaneously drives lines of a plurality of pairs of physically adjacent first row lines and/or second column lines to complementary logic levels and keeps the crosspoint transistors connected to said plurality of pairs in an off state to facilitate a detection of a bridging fault via a measurement of a quiescent power supply current.

2. An integrated circuit according to claim 1, characterized in that the test circuit includes logic gates, and the bit lines and the product term lines are connected to respective outputs of the logic gates, an input of each logic gate being connected to a first test control line such that the logic gates enable driving the bit lines and product term lines to a switch off level of the crosspoint transistors connected thereto, under control of the first test control line.

3. An integrated circuit according to claim 2, characterized in that the precharge lines are connected to respective precharge transistors and that the evaluate lines are connected to respective evaluate transistors, such that adjacent first row lines and adjacent second column lines switch to complementary logic levels.

4. An integrated circuit according to claim 2, characterized in that the precharge lines are connected to respective precharge transistors switching the precharge lines in a normal mode to a first level, and the evaluate lines are connected to respective evaluate transistors switching the evaluate lines in the normal mode to a second level, complementary to the first level, pairs of corresponding precharge transistors and evaluate transistors being arranged for inverting said levels under control of a second test control line, said pairs being chosen such that in the test mode adjacent first row lines and adjacent second column lines switch to complementary logic levels.

5. An integrated circuit according to claim 4, characterized in that the circuit is arranged for during the test mode keeping the precharge transistors and the evaluate transistors in an on state simultaneously.

6. An integrated circuit according to claim 4, characterized in that the circuit is arranged for during the test mode keeping the precharge transistors in an off state and the evaluate transistors in an on state simultaneously.

7. An integrated circuit according to claim 3, characterized in that the circuit is arranged for during the test mode keeping the precharge transistors in an off state and the evaluate transistors in an on state simultaneously.

8. An integrated circuit according to claim 3, characterized in that the circuit is arranged for during the test mode keeping the precharge transistors and the evaluate transistors in an on state simultaneously.

9. A method for testing an integrated circuit comprising a dynamic CMOS Programmable Logic Array with an AND plane and an OR plane, characterized in that the method comprises the steps of (1) driving lines of pairs of adjacent row lines in the AND plane and pairs of adjacent column lines in the OR plane to complementary logic levels while simultaneously keeping crosspoint transistors feeding said lines in an off state and measuring a quiescent power supply current;

(2) driving lines of pairs of adjacent column lines in the AND plane and pairs of adjacent row lines in the OR plane to complementary logic levels while measuring a quiescent power supply current.

10. An integrated circuit, comprising:

a programmable logic array having a logic plane, the logic plane having a plurality of pairs of physically adjacent signal lines, with each pair having a crosspoint transistor selectively coupling and decoupling the respective lines of that pair; and a test circuit which during a test mode (i) simultaneously drives the plurality of pairs of physically adjacent signal lines so that in each pair one line of the pair is driven at a first logic level and the other line of the pair is driven at a second, complementary logic level whereby a potential difference arises between the lines of each pair and (ii) controls the crosspoint transistors to decouple the lines of each pair, whereby bridging faults present between the lines of each pair are detectable by the presence of current flow through any such bridging faults between the lines of each pair.

11. An integrated circuit according to claim 10, wherein the logic plane is an AND plane and the pairs of adjacent signal lines include a product line and a respective evaluate line.

12. An integrated circuit according to claim 10, wherein the logic plane is an OR plane and the pairs of adjacent signal lines include a sum line and a respective evaluate line.

13. An integrated circuit according to claim 10, further comprising a current sensor coupled to the logic plane which detects increased quiescent current as a result of bridging faults.

* * * * *